United States Patent
Maeyama et al.

(10) Patent No.: US 9,496,366 B2
(45) Date of Patent: Nov. 15, 2016

(54) METHOD FOR MANUFACTURING SILICON CARBIDE (SIC) SEMICONDUCTOR DEVICE BY INTRODUCING NITROGEN CONCENTRATION OF 5X1019 CM-3 OR MORE AT A BOUNDARY SURFACE BETWEEN THERMAL OXIDE FILM AND THE SIC SUBSTRATE AND THEN REMOVING THE THERMAL OXIDE FILM

(71) Applicant: SHINDENGEN ELECTRIC MANUFACTURING CO., LTD., Chiyoda-ku, Tokyo (JP)

(72) Inventors: Yusuke Maeyama, Hanno (JP); Yoshiyuki Watanabe, Hanno (JP); Shunichi Nakamura, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/391,453

(22) PCT Filed: Oct. 8, 2013

(86) PCT No.: PCT/JP2013/077401
§ 371 (c)(1),
(2) Date: Oct. 9, 2014

(87) PCT Pub. No.: WO2015/052782
PCT Pub. Date: Apr. 16, 2015

(65) Prior Publication Data
US 2016/0056260 A1 Feb. 25, 2016

(51) Int. Cl.
*H01L 29/66* (2006.01)
*H01L 29/872* (2006.01)
*H01L 29/861* (2006.01)
*H01L 29/16* (2006.01)
(Continued)

(52) U.S. Cl.
CPC ..... *H01L 29/6606* (2013.01); *H01L 21/02236* (2013.01); *H01L 21/02255* (2013.01);
(Continued)

(58) Field of Classification Search
None
See application file for complete search history.

(56) References Cited

U.S. PATENT DOCUMENTS 8,178,940 B2 * 5/2012 Nakamura ............... H01L 29/47
257/471
2006/0216879 A1 * 9/2006 Nonaka ............... H01L 29/7722
438/186
(Continued)

FOREIGN PATENT DOCUMENTS

JP 2002525849 A 8/2002
JP 200624880 A 1/2006

OTHER PUBLICATIONS

Extended European Search Report dated Sep. 30, 2015, corresponding to European Patent Application No. 13876770.2.
(Continued)

*Primary Examiner* — Michael Jung
(74) *Attorney, Agent, or Firm* — Hauptman Ham, LLP

(57) ABSTRACT

A method for manufacturing a semiconductor device includes forming a thermal oxide film on one surface of an SiC substrate by thermal oxidation at a temperature of 1150° C. or above in a gas atmosphere including nitrogen and oxygen, and introducing highly-concentrated nitrogen to one surface of the SiC substrate while forming the thermal oxide film; forming a highly-concentrated n-type SiC layer on one surface of the SiC substrate such that the thermal oxide film is removed from one surface of the SiC substrate by etching and, thereafter, one surface of the SiC substrate is exposed to radicals so that Si—N bonded bodies and C—N bonded bodies on one surface of the SiC substrate are removed while leaving nitrogen introduced into a lattice of SiC out of highly-concentrated nitrogen introduced into one surface of the SiC substrate; and forming an ohmic electrode layer on one surface of the SiC substrate.

10 Claims, 11 Drawing Sheets

(51) Int. Cl.
   *H01L 21/04*      (2006.01)
   *H01L 21/02*      (2006.01)
   *H01L 21/311*     (2006.01)
   *H01L 29/167*     (2006.01)
   *H01L 23/29*      (2006.01)
   *H01L 29/45*      (2006.01)
   *H01L 29/06*      (2006.01)

(52) U.S. Cl.
   CPC ... *H01L 21/02378* (2013.01); *H01L 21/02529* (2013.01); *H01L 21/0455* (2013.01); *H01L 21/0485* (2013.01); *H01L 21/31111* (2013.01); *H01L 29/167* (2013.01); *H01L 29/1608* (2013.01); *H01L 29/66136* (2013.01); *H01L 29/66143* (2013.01); *H01L 29/8611* (2013.01); *H01L 29/872* (2013.01); *H01L 23/291* (2013.01); *H01L 29/0619* (2013.01); *H01L 29/45* (2013.01); *H01L 2924/0002* (2013.01)

(56) References Cited

U.S. PATENT DOCUMENTS

| | | | |
|---|---|---|---|
| 2011/0227096 A1* | 9/2011 | Wada | H01L 21/0445 257/77 |
| 2012/0228636 A1* | 9/2012 | Maeyama | H01L 29/0619 257/77 |
| 2015/0303271 A1* | 10/2015 | Tanaka | H01L 21/28 257/77 |
| 2015/0364551 A1* | 12/2015 | Shimizu | H01L 29/1608 257/77 |

OTHER PUBLICATIONS

International Search Report mailed Jan. 14, 2014, in International Application No. PCT/JP2013/077401.

\* cited by examiner

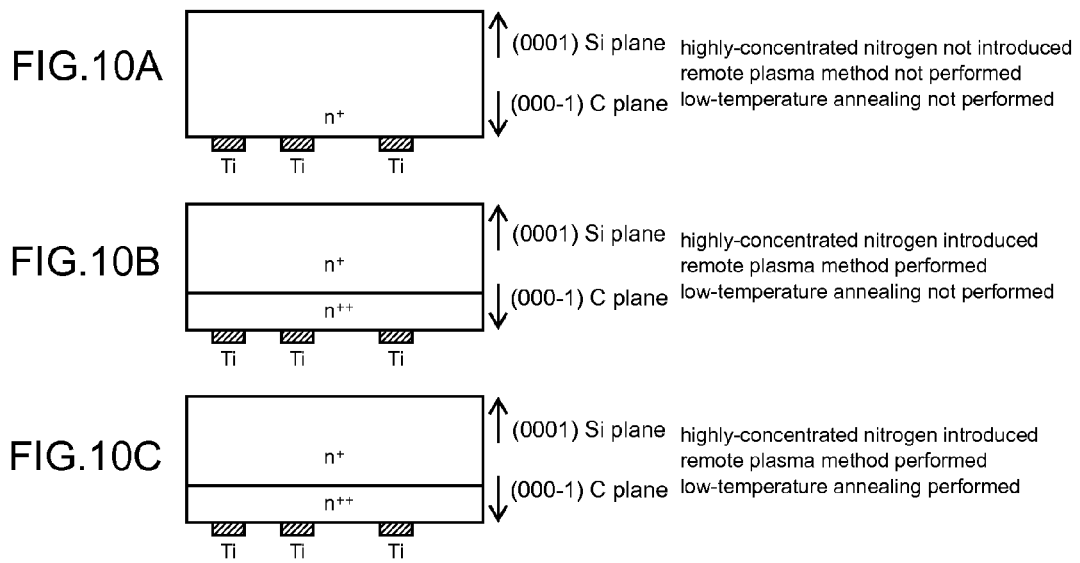
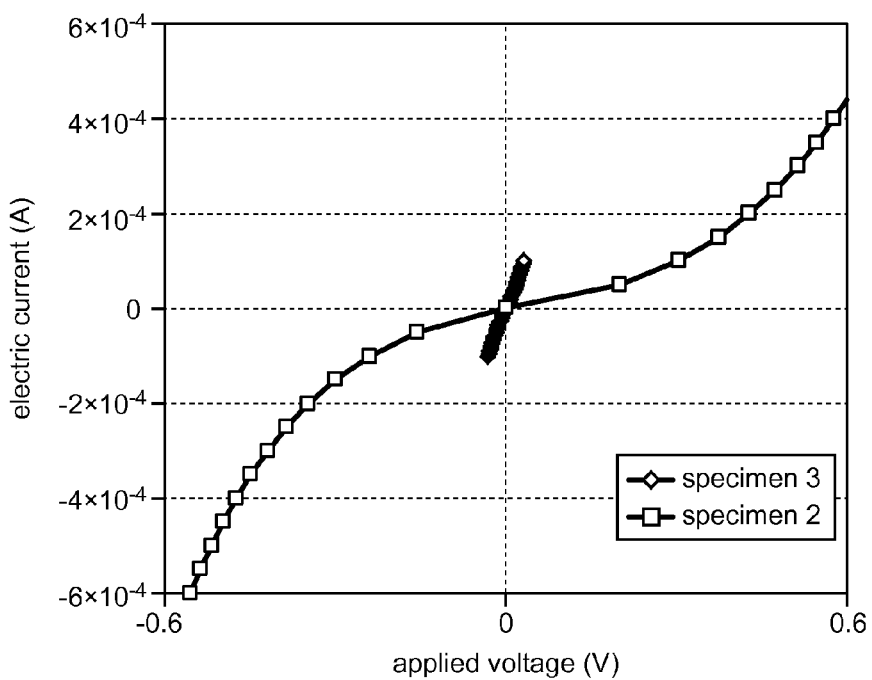
FIG.11

METHOD FOR MANUFACTURING SILICON CARBIDE (SIC) SEMICONDUCTOR DEVICE BY INTRODUCING NITROGEN CONCENTRATION OF 5X1019 CM-3 OR MORE AT A BOUNDARY SURFACE BETWEEN THERMAL OXIDE FILM AND THE SIC SUBSTRATE AND THEN REMOVING THE THERMAL OXIDE FILM

RELATED APPLICATIONS

The present application is a National Phase of International Application Number PCT/JP2013/077401, filed Oct. 8, 2013.

TECHNICAL FIELD

The present invention relates to a method for manufacturing a silicon carbide semiconductor device.

BACKGROUND ART

A silicon carbide semiconductor device is a semiconductor device which includes a silicon carbide layer (SiC layer), and has excellent technical features such as a high breakdown voltage, a low loss, a low leakage current, high-temperature operability, and high-speed operability. Accordingly, the application of the silicon carbide semiconductor device to a power element such as a switching element or a rectifying element has been highly anticipated. As the power element, although a power MOSFET, an IGBT, a Schottky diode, a pn diode, a thyristor or the like has been known, all these power elements have an ohmic electrode layer which is in contact with an SiC layer so that, in many cases, an electric current of several amperes flows between the SiC layer and the ohmic electrode layer.

Conventionally, as a method for manufacturing a silicon carbide semiconductor device, there has been known a method described in patent literature 1 (a conventional method for manufacturing a silicon carbide semiconductor device). FIG. 14A to FIG. 14E are views for explaining the conventional method for manufacturing a silicon carbide semiconductor device. FIG. 14A to FIG. 14E are views showing respective steps. The conventional method for manufacturing a silicon carbide semiconductor device sequentially includes, as shown in FIG. 14A to FIG. 14E, an Ni layer forming step where an Ni layer 920 is formed on an SiC layer 910 (FIG. 14A), a high-temperature annealing step where an alloy layer 926 constituted of a reaction layer 922 and a silicide layer 924 is formed on the SiC layer 910 by making the SiC layer 910 and the Ni layer 920 react with each other at a temperature of 950° C. or above ((FIG. 14B and FIG. 14C), an etching step where a surface of the reaction layer 922 is exposed by removing the silicide layer 924 (FIG. 14D), and an electrode layer forming step where an ohmic electrode layer 930 and other electrode layers 932 are formed on a surface of the reaction layer 922 (FIG. 14E) in this order.

According to the conventional method for manufacturing a silicon carbide semiconductor device, carbon components in the SiC layer 910 are not diffused into the ohmic electrode layer 930. As a result, the adhesive property between the ohmic electrode layer 930 and other electrode layers 932 can be improved. Accordingly, it is possible to manufacture a highly reliable silicon carbide semiconductor device which can decrease a possibility of peeling off of an electrode while ensuring a favorable contact between the SiC layer and the electrode layer.

PRIOR ART LITERATURE

Patent Literature

Patent Literature 1: JP-A-2006-24880
Patent Literature 2: JP-A-2002-525849

SUMMARY OF THE INVENTION

Technical Problem

However, in the conventional method for manufacturing a silicon carbide semiconductor device, it is necessary to perform the high-temperature annealing step as described above and hence, there arises a drawback that "carbon which is produced as a byproduct" and "peeled-off electrode material" are generated in the high-temperature annealing step and such materials become contamination sources in succeeding steps and contaminates a manufacturing line.

Further, in the conventional method for manufacturing a silicon carbide semiconductor device, it is necessary to perform the high-temperature annealing step as described above and hence, there arises a drawback that various restrictions are imposed on a wafer step. For example, in the case where the conventional method for manufacturing a silicon carbide semiconductor device is applied to a method for manufacturing a Shottky barrier diode, when an ohmic electrode layer is formed after a barrier metal layer is formed, a rectifying function of the barrier metal layer is dissipated in the course of performing the high-temperature annealing step thus giving rise to a drawback that it is necessary to form an ohmic electrode layer before the barrier metal layer is formed.

The present invention has been made to overcome the above-mentioned drawbacks, and it is an object of the present invention to provide a method for manufacturing a silicon carbide semiconductor device which can form an ohmic electrode layer on an SiC layer without performing a high-temperature annealing step which induces the above-mentioned drawbacks.

Solution to Problem

[1] According to one aspect of the present invention, there is provided a method for manufacturing a silicon carbide semiconductor device which includes the steps in the following order: a first step of forming a thermal oxide film on one surface of an SiC substrate by thermal oxidation at a temperature of 1150° C. or above in a gas atmosphere including molecules which contain nitrogen and oxygen, and introducing highly-concentrated nitrogen to one surface of the SiC substrate in the course of forming the thermal oxide film; a second step of forming a highly-concentrated n-type SiC layer on one surface of the SiC substrate such that the thermal oxide film is removed from one surface of the SiC substrate by etching and, thereafter, one surface of the SiC substrate is exposed to radicals so that Si—N bonded bodies and C—N bonded bodies which are formed on one surface of the SiC substrate in the course of introducing highly-concentrated nitrogen into one surface of the SiC substrate are removed while leaving nitrogen introduced into a lattice of SiC out of highly-concentrated nitrogen introduced into one surface of the SiC substrate; and a third step of forming an ohmic electrode layer on one surface of the SiC substrate.

[2] In the method for manufacturing a silicon carbide semiconductor device of the present invention, it is preferable that the first step is carried out under a condition where nitrogen concentration on a boundary surface between the thermal oxide film and the SiC substrate is $5 \times 10^{19}$ cm$^{-3}$ or more.

[3] In the method for manufacturing a silicon carbide semiconductor device of the present invention, the first step is preferably carried out under a condition where the maximum nitrogen concentration in the thermal oxide film is $1 \times 10^{20}$ cm$^{-3}$ or more.

[4] In the method for manufacturing a silicon carbide semiconductor device of the present invention, it is preferable that, in the first step, nitrogen is introduced into the SiC substrate to a depth position of 5 to 20 nm from a lower surface of the thermal oxide film.

[5] In the method for manufacturing a silicon carbide semiconductor device of the present invention, it is preferable that the first step is carried out in a state where the other surface of the SiC substrate is covered with a silicon nitride film.

[6] In the method for manufacturing a silicon carbide semiconductor device of the present invention, it is preferable that, in the second step, the thermal oxide film is removed from one surface of the SiC substrate by wet etching using a buffered hydrofluoric acid.

[7] In the method for manufacturing a silicon carbide semiconductor device of the present invention, it is preferable that, in the second step, the Si—N bonded bodies and the C—N bonded bodies are removed by supplying the radicals to one surface of the SiC substrate using a remote plasma method.

[8] In the method for manufacturing a silicon carbide semiconductor device of the present invention, it is preferable that, in the second step, $CF_4$, $C_2F_6$, $SiF_4$, $F_2$ and/or $O_2$ are/is used as a radical source.

[9] In the method for manufacturing a silicon carbide semiconductor device of the present invention, it is preferable that, in the third step, the ohmic electrode layer is formed on one surface of the SiC substrate and, thereafter, resistance at a bonded portion between the SiC substrate and the ohmic electrode layer is decreased by performing annealing at a temperature which falls within a range of 400° C. to 550° C.

[10] In the method for manufacturing a silicon carbide semiconductor device of the present invention, it is preferable that the silicon carbide semiconductor device is a Schottky barrier diode.

[11] In the method for manufacturing a silicon carbide semiconductor device of the present invention, it is preferable that the silicon carbide semiconductor device is a pn diode.

Advantageous Effects of Invention

According to the method for manufacturing a silicon carbide semiconductor device of the present invention, highly-concentrated nitrogen is introduced into one surface of the SiC substrate in the first step. In the second step, by exposing one surface of the SiC substrate to radicals, the Si—N bonded bodies and the C—N bonded bodies (bonded bodies which increase electric resistance) which are formed on one surface of the SiC substrate in the course of introducing highly-concentrated nitrogen into one surface of the SiC substrate are removed while leaving nitrogen introduced into a lattice of SiC out of highly-concentrated nitrogen introduced into one surface of the SiC substrate thus forming the highly-concentrated n-type SiC layer on one surface of the SiC substrate (see FIG. 9 described later, wherein nitrogen having concentration of $8 \times 10^{19}$ cm$^{-3}$ still remains even after a thermal oxide film having a depth of approximately 30 nm from the surface is removed). Accordingly, in the succeeding third step, in forming the ohmic electrode layer on one surface of the SiC substrate, by merely performing an annealing step at a relatively low temperature or even when an annealing step per se is omitted, it is possible to form a favorable ohmic junction between the SiC substrate and the ohmic electrode layer.

As a result, according to the method for manufacturing a silicon carbide semiconductor device of the present invention, it is unnecessary to perform a high-temperature annealing step as described above and hence, the ohmic electrode layer can be formed on the surface of the SiC layer without performing the high-temperature annealing step.

Further, according to the method for manufacturing a silicon carbide semiconductor device of the present invention, it is unnecessary to perform the high-temperature annealing step as described above and hence, there is no possibility that "carbon which is produced as a byproduct" and "peeled-off electrode material" generated in the high-temperature annealing step become a contamination source in succeeding steps and contaminate a manufacturing line.

According to the method for manufacturing a silicon carbide semiconductor device of the present invention, it is unnecessary to perform the high-temperature annealing step as described above and hence, a drawback that various restrictions are imposed on a wafer step is eliminated. For example, when the method for manufacturing a silicon carbide semiconductor device of the present invention is applied to a method for manufacturing a Schottky barrier diode, it is unnecessary to perform the high-temperature annealing step. Accordingly, there is no possibility that a rectifying function of the barrier metal layer is dissipated. Further, it is also possible to eliminate the restriction that it is necessary to form the ohmic electrode layer before the barrier metal layer is formed.

Patent literature 2 (JP-A-2002-525849) discloses a technique where a highly-concentrated n-type SiC layer is formed on a surface of an SiC substrate by introducing nitrogen (atomic nitrogen or 2 atomic nitrogen) on a surface of the SiC substrate at a room temperature by an ion implantation method.

However, the technique disclosed in patent literature 2 has a drawback that in a sacrifice oxidation step and an oxidation step which come after nitrogen is introduced into a surface of the SiC substrate by an ion implantation method, nitrogen introduced into the surface of the SiC substrate is liable to be dissipated. This is because when a large amount of nitrogen is injected by ion implantation to an extent that an ohmic contact is formed, a crystal defect occurs in an ion injected portion and an oxidation speed is increased. Further, a (000-1) C plane which is usually used as a back side surface is larger than a (0001) Si plane which is used as a front side surface in an oxidation speed by approximately one digit. To the contrary, according to the method for manufacturing a silicon carbide semiconductor device of the present invention, nitrogen is introduced in the oxidation step (first step) and hence, the manufacturing method has no such drawback.

The method for manufacturing a silicon carbide semiconductor device according to the present invention is applicable to a method for manufacturing a Schottky barrier diode (see FIG. 1 to FIG. 3 described later), and it is also applicable to a method for manufacturing a pn diode (see FIG. 4 to FIG. 6 described later).

BRIEF DESCRIPTION OF DRAWINGS

FIG. 10A to FIG. 10C are views for explaining specimens (specimens 2 to 4) in the example 2.

FIG. 11 is a view showing I-V characteristics of a specimen 2 and a specimen 3 in an overlapping manner.

DESCRIPTION OF EMBODIMENTS

Figure 1A:
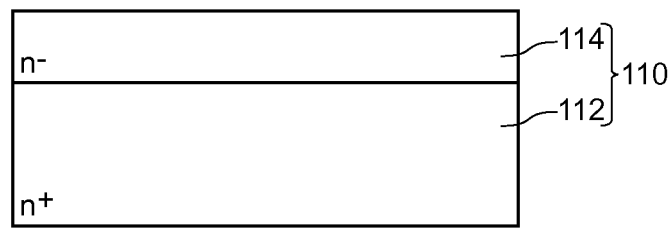
FIG. 1A to FIG. 1D are views for explaining a method for manufacturing a silicon carbide semiconductor device according to an embodiment 1.

Hereinafter, a method for manufacturing a silicon carbide semiconductor device of the present invention is explained in conjunction with embodiments shown in the drawings.

Embodiment 1

FIG. 1A to FIG. 3D are views for explaining a method for manufacturing a silicon carbide semiconductor device according to an embodiment 1. FIG. 1A to FIG. 1D, FIG. 2A to FIG. 2E and FIG. 3A to FIG. 3D are views showing respective steps. In the embodiment 1, the present invention is explained by taking a case where a Schottky barrier diode is manufactured as a silicon carbide semiconductor device as an example.

The method for manufacturing a silicon carbide semiconductor device according to the embodiment 1 includes: "SiC substrate preparing step"; "guard ring layer forming step"; "protective insulation film forming step"; "nitride film and thermal oxide film removing step"; "highly-concentrated nitrogen introducing step (first step)"; "highly-concentrated n-type SiC layer forming step (second step)"; "opening forming step"; "anode electrode layer forming step"; and "ohmic electrode layer forming step (third step)". Hereinafter, the method for manufacturing a silicon carbide semiconductor device according to the embodiment 1 is explained in accordance with these steps.

1. SiC Substrate Preparing Step

Firstly, an SiC substrate 110 having the structure where an $n^+$ type SiC layer 112 and an $n^-$ type SiC layer 114 which is epitaxially grown on the $n^+$ type SiC layer 112 are laminated to each other is prepared (see FIG. 1A). A thickness of the $n^+$ type SiC layer 112 is 400 μm, for example, and the impurity concentration of the $n^+$ type SiC layer 112 is $5\times10^{18}$ cm$^{-3}$, for example. A thickness of the $n^-$ type SiC layer 114 is 10 μm, for example, and the impurity concentration of the $n^-$ type SiC layer 114 is $1\times10^{16}$ cm$^{-3}$, for example.

2. Guard Ring Layer Forming Step

Figure 1B:
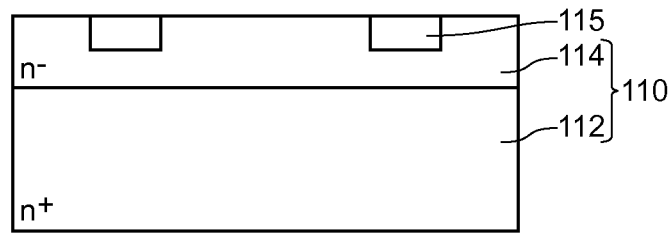
Figure 1C:
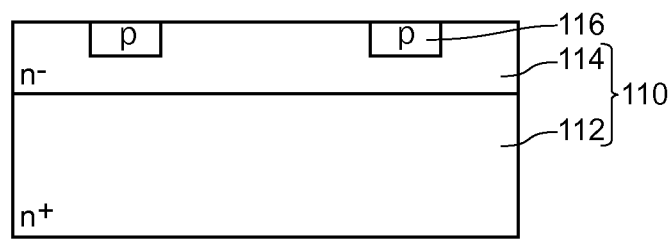
Figure 1D:
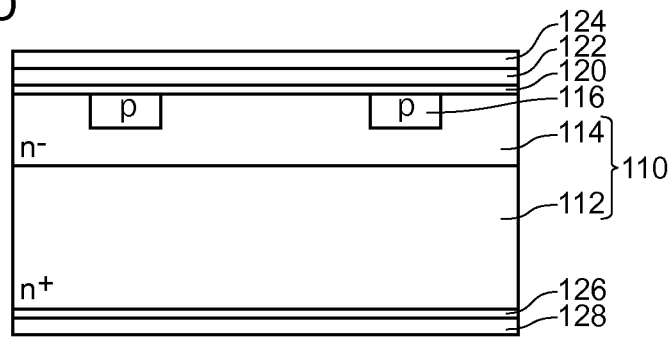

Then, an Al ion introduced region 115 is formed by introducing Al ion into a predetermined region (outer peripheral portion) on a surface of the $n^-$ type SiC layer 114 by an ion implantation method (see FIG. 1B). The energy of the ion implantation is 30 to 400 keV, for example, and a depth of the Al ion introduced region 115 is 0.5 μm, for example, and impurity concentration in the Al ion introduced region 115 is 2 to $5\times10^{17}$ cm$^{-3}$, for example. Then, annealing treatment (activated annealing treatment) of Al ion is performed at a temperature of 1500° C. or above thus forming a p-type guard ring region 116 (see FIG. 1C).

3. Protective Insulation Film Forming Step

Then, a thermal oxide film 120 is formed on the other surface ($n^-$ type SiC layer 114) of the SiC substrate 110 by a thermal oxidation method using wet oxygen (Wet $O_2$), and a thermal oxide film 126 is formed on one surface of the SiC substrate 110 ($n^+$ type SiC layer 112). When the other surface side of the SiC substrate is a (0001) Si plane, a film thickness of the thermal oxide film 120 is 0.06 μm, for example. When one surface side of the SiC substrate is a (000-1) C plane, a film thickness of the thermal oxide film 120 is 0.6 μm, for example. Then, an NSG film 122 is formed on the thermal oxide film 120 by a TEOS or CVD method, for example. A film thickness of the NSG film 122 is 1 μm, for example. Then, a $Si_3N_4$ film (nitride film) 124 is formed on the NSG film 122 by a reduced pressure CVD method. Here, a $Si_3N_4$ film (nitride film) 128 is formed also on the thermal oxide film 126 formed on a back surface of the SiC substrate 110. Film thicknesses of the nitride films 124, 128 are 0.1 μm, for example. Accordingly, a protective insulation film which is constituted of the thermal oxide film 120, the NSG film 122 and the nitride film 124 is formed on the surface of the $n^-$ type SiC layer 114, and a protective insulation film which is constituted of the thermal oxide film 126 and the nitride film 128 is formed on the surface of the $n^+$ type SiC layer 112 (see FIG. 1D).

4. Nitride Film and Thermal Oxide Film Removing Step

Then, out of the nitride films 124, 128, the nitride film 128 formed on an $n^+$ type SiC layer 112 side is removed by capacitive coupling type dry etching. At the same time, out of the thermal oxide films 120, 126, the thermal oxide film 126 formed on an $n^+$ type SiC layer 112 side is removed by a buffered hydrofluoric acid (see FIG. 2A).

5. Highly-Concentrated Nitrogen Introducing Step (First Step of Method of the Present Invention)

Figure 2A:
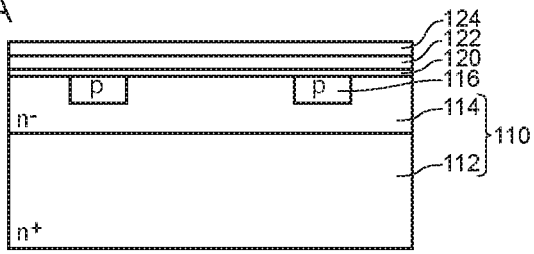
FIG. 2A to FIG. 2E are views for explaining the method for manufacturing a silicon carbide semiconductor device according to the embodiment 1.
Figure 2B:
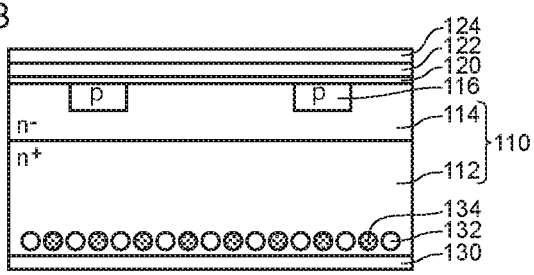
Figure 2C:
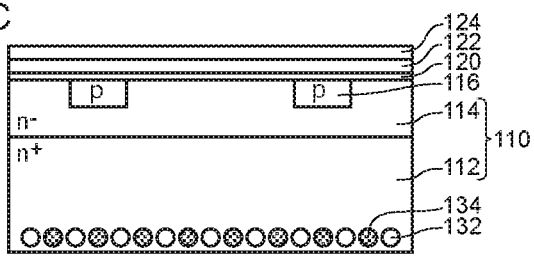

Then, a thermal oxide film 130 is formed by thermally oxidizing one surface of the SiC substrate 110 (a surface of the $n^+$ type SiC layer 112) at a temperature of 1150° C. or above in a gas atmosphere including molecules (NO, for example) which contain nitrogen and oxygen (see FIG. 2B). Here, highly-concentrated nitrogen is introduced into one surface of the SiC substrate 110 (a surface of the n⁺ type SiC layer 112). The nitrogen introduced into one surface of the SiC substrate 110 (a surface of the n⁺ type SiC layer 112) includes "nitrogen 132 introduced into a lattice of SiC" and nitrogen which constitutes "Si—N bonded bodies and C—N bonded bodies 134".

In the highly-concentrated nitrogen introducing step, the nitride film 124 exists on the other surface of the SiC substrate 110 (a surface of the n⁻ type SiC layer 114). Accordingly, no nitrogen is introduced into the other surface of the SiC substrate 110 (a surface of the n⁻ type SiC layer 114).

In the highly-concentrated nitrogen introducing step, as understood from FIG. 9 described later, highly-concentrated nitrogen is introduced not only into the inside of the thermal oxide film 130 but also into the surface of the n⁺ type SiC layer 112 (to a depth position of 5 to 20 nm from a lower surface of the thermal oxide film 130, for example). Here, the maximum nitrogen concentration in the thermal oxide film 130 becomes $2 \times 10^{20}$ cm$^{-3}$, for example, and nitrogen concentration on a boundary surface between the thermal oxide film 130 and the SiC substrate 110 (n⁺ type SiC layer 112) becomes $8 \times 10^{19}$ cm$^{-3}$, for example.

6. Highly-Concentrated n-Type SiC Layer Forming Step (Second Step of the Method of the Present Invention)
(1) Thermal Oxide Film Removing Step Then, the thermal oxide film 130 is removed from one surface of the SiC substrate 110 (a surface of the n⁺ type SiC layer 112) by wet etching using a buffered hydrofluoric acid (see FIG. 2C).

(2) Radical Exposure Step

Figure 2D:
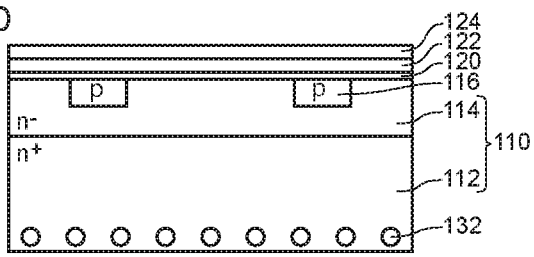
Figure 2E:
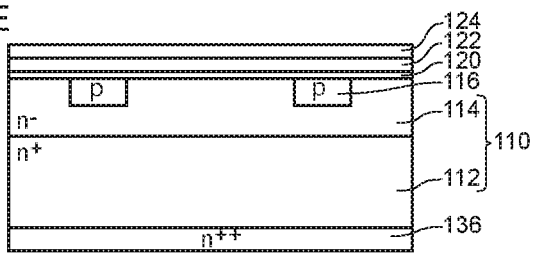

Then, one surface of the SiC substrate 110 (a surface of the n⁺ type SiC layer 112) is exposed to radicals so that Si—N bonded bodies and C—N bonded bodies which are formed on one surface of the SiC substrate 110 (a surface of the n⁺ type SiC layer 112) in the course of introducing highly-concentrated nitrogen into one surface of the SiC substrate 110 (a surface of the n⁺ type SiC layer 112) are removed while leaving nitrogen introduced into a lattice of SiC out of nitrogen introduced into one surface of the SiC substrate 110 (a surface of the n⁺ type SiC layer 112) thus forming the highly-concentrated n type SiC layer (n⁺⁺ type SiC layer) 136 on one surface of the SiC substrate 110 (a surface of n⁺ type SiC layer 112) (see FIG. 2D). In this radical exposure step, radicals are supplied to one surface of the SiC substrate 110 (a surface of the n⁺ type SiC layer 112) by a remote plasma method. As a radical supply source, $CF_4$, $C_2F_6$, $SiF_4$, $F_2$ and/or $O_2$ are used, for example.

7. Opening Forming Step

Figure 3A:
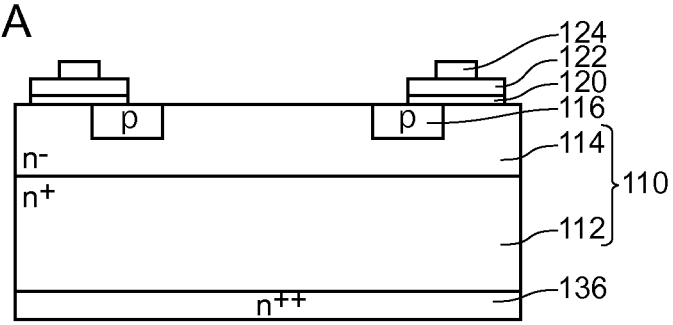
FIG. 3A to FIG. 3D are views for explaining the method for manufacturing a silicon carbide semiconductor device according to the embodiment 1.
Figure 3B:
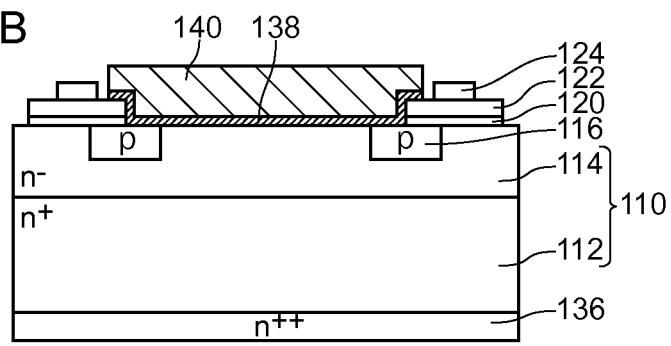
Figure 3C:
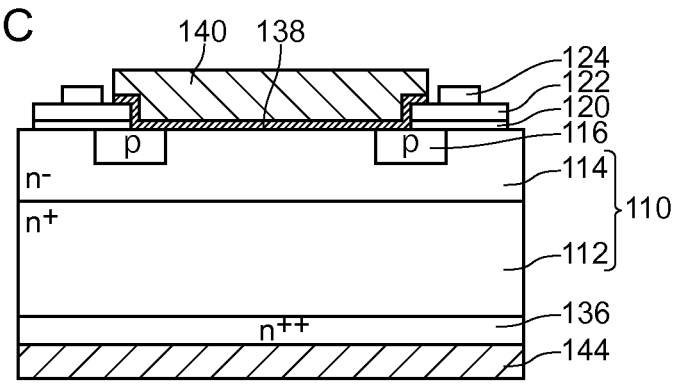
Figure 3D:
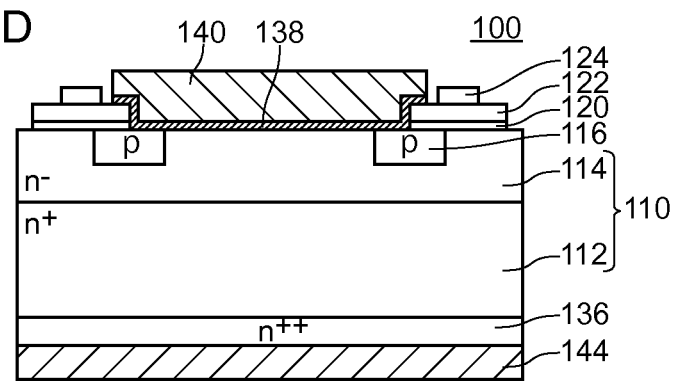

Then, openings having predetermined shapes are formed in the nitride film 124, the NSG film 122 and the thermal oxide film 120 respectively by capacitive-coupling-type dry etching and wet etching using a buffered hydrofluoric acid, for example (see FIG. 3A).

8. Anode Electrode Layer Forming Step

Then, a barrier metal layer 138 made of Ti, for example, is formed in the above-mentioned openings formed in the other surface of the SiC substrate 110 (a surface of the n⁻ type SiC layer 114). A thickness of the barrier metal layer 138 is 0.1 µm to 0.5 µm, for example. Then, a wire connection metal layer 140 made of Al, for example, is formed on the barrier metal layer 138. A thickness of the wire connection metal layer 140 is 3 µm, for example. Accordingly, an anode electrode layer constituted of the barrier metal layer 138 and the wire connection metal layer 140 is formed on the other surface of the SiC substrate 110 (a surface of the n⁻ type SiC layer 114) (see FIG. 3B).

9. Ohmic Electrode Layer Forming Step
(1) Ohmic Electrode Layer Film Forming Step Then, an ohmic electrode layer 144 formed of a laminated film consisting of a Ti layer (0.1 µm), an Ni layer (0.5 µm) and an Ag layer (0.1 µm), for example, is formed on one surface of the SiC substrate 110 (surface of highly-concentrated n-type SiC layer 136). Here, the highly-concentrated n type SiC layer (n⁺⁺ type SiC layer) 136 is formed on one surface of the SiC substrate 110 and hence, a favorable ohmic junction can be formed between the SiC substrate 110 (a surface of the highly-concentrated n-type SiC layer 136) and the ohmic electrode layer 144. The ohmic electrode layer 144 constitutes a cathode electrode layer of the Schottky barrier diode (see FIG. 3C).

(2) Low-Temperature Annealing Step

Then, the ohmic electrode layer 144 is annealed by low-temperature annealing at a temperature which falls within a range of 400° C. to 550° C. (for example, 450° C.) thus forming a more favorable ohmic junction between the SiC substrate 110 (highly-concentrated n-type SiC layer 136) and the ohmic electrode layer 144 (see FIG. 3D).

By carrying out the above-mentioned steps, the silicon carbide semiconductor device 100 (Schottky barrier diode) can be manufactured.

According to the method for manufacturing a silicon carbide semiconductor device of the embodiment 1, highly-concentrated nitrogen is introduced into one surface of the SiC substrate 110 in the first step. In the second step, by exposing one surface of the SiC substrate 110 to radicals, the Si—N bonded bodies and the C—N bonded bodies (bonded bodies which increase electric resistance) which are formed on one surface of the SiC substrate 110 in the course of introducing highly-concentrated nitrogen into one surface of the SiC substrate 110 are removed while leaving nitrogen (nitrogen working as a donor and decreasing electric resistance) introduced into a lattice of SiC out of highly-concentrated nitrogen introduced into one surface of the SiC substrate 110 thus forming the highly-concentrated n-type SiC layer 136 on one surface of the SiC substrate 110 (see FIG. 9 described later, wherein nitrogen having concentration of $8 \times 10^{19}$ cm$^{-3}$ still remains even after a thermal oxide film having a depth of approximately 30 nm from the surface is removed). Accordingly, in the succeeding third step, in forming the ohmic electrode layer 144 on one surface of the SiC substrate 110, by merely performing an annealing step at a relatively low temperature or even when an annealing step per se is omitted, it is possible to form a favorable ohmic junction between the SiC substrate and the ohmic electrode layer.

As a result, according to the method for manufacturing a silicon carbide semiconductor device of the embodiment 1, it is unnecessary to perform a high-temperature annealing step as described above and hence, the ohmic electrode layer can be formed on the surface of the SiC layer without performing the high-temperature annealing step.

Further, according to the method for manufacturing a silicon carbide semiconductor device of the embodiment 1, it is unnecessary to perform the high-temperature annealing step as described above and hence, there is no possibility that "carbon which is produced as a byproduct" and "peeled-off electrode material" generated in the high-temperature annealing step become a contamination source in succeeding steps and contaminate a manufacturing line.

According to the method for manufacturing a silicon carbide semiconductor device of the embodiment 1, it is unnecessary to perform the high-temperature annealing step as described above and hence, a drawback that various restrictions are imposed on a wafer step is eliminated. That is, it is unnecessary to perform the high-temperature annealing step and hence, there is no possibility that a rectifying function of the barrier metal layer is dissipated whereby it is also possible to eliminate the restriction that it is necessary to form the ohmic electrode layer before the barrier metal layer is formed.

According to the method for manufacturing a silicon carbide semiconductor device of the embodiment 1, the first step is performed under the condition where the nitrogen concentration on the boundary surface of the thermal oxide film 130 and the SiC substrate 110 is $5 \times 10^{19}$ cm$^{-3}$ or above and hence, nitrogen of sufficiently high concentration can be introduced into one surface of the SiC substrate 110.

According to the method for manufacturing a silicon carbide semiconductor device of the embodiment 1, the first step is performed under the condition where the maximum nitrogen concentration in the thermal oxide film 130 is $1 \times 10^{20}$ cm$^{-3}$ or more and hence, nitrogen of sufficiently high concentration can be introduced into one surface of the SiC substrate 110 (a surface of the n$^+$ type SiC layer 112).

Further, according to the method for manufacturing a silicon carbide semiconductor device of the embodiment 1, in the first step, nitrogen is introduced into the SiC substrate to a position 5 to 20 nm deeper from a lower surface of the thermal oxide film 130 and hence, the highly-concentrate n type SiC layer can be formed down to a depth position which is sufficiently deep in one surface of the SiC substrate.

According to the method for manufacturing a silicon carbide semiconductor device of the embodiment 1, the first step is performed in a state that the other surface of the SiC substrate 110 is covered with the nitride film and hence, nitrogen is not introduced into the other surface of the SiC substrate 110.

According to the method for manufacturing a silicon carbide semiconductor device of the embodiment 1, in the second step, the thermal oxide film 130 is removed from one surface of the SiC substrate 110 by wet etching using a buffered hydrofluoric acid and hence, one surface of the SiC substrate 110 is completely exposed. Thereafter, one surface of the SiC substrate 110 in a completely exposed state can be exposed to radicals.

According to the method for manufacturing a silicon carbide semiconductor device of the embodiment 1, in the second step, radicals are supplied to one surface of the SiC substrate 110 by a remote plasma method. Accordingly, the highly-concentrated n-type SiC layer can be formed on one surface of the SiC substrate 110 by removing "the Si—N bonded bodies and the C—N bonded bodies 134" formed on one surface of the SiC substrate 110 in the course of introducing highly-concentrated nitrogen into one surface of the SiC substrate 110 while leaving nitrogen 132 introduced into a lattice of SiC out of highly-concentrated nitrogen introduced into one surface of the SiC substrate 110.

According to the method for manufacturing a silicon carbide semiconductor device of the embodiment 1, in the second step, CF$_4$, C$_2$F$_6$, SiF$_4$, F$_2$ and/or O$_2$ are/is used as a radical source and hence, only "the Si—N bonded bodies and the C—N bonded bodies 134" can be selectively removed by a remote plasma method.

According to the method for manufacturing a silicon carbide semiconductor device of the embodiment 1, in the third step, resistance of a junction portion between the SiC substrate 110 (highly-concentrated n type SiC layer 136) and the ohmic electrode layer 144 is reduced by annealing the SiC substrate at a temperature which falls within a range of 400° C. to 550° C. after the ohmic electrode layer is formed on one surface of the SiC substrate. Accordingly, a favorable ohmic junction can be formed between the SiC substrate 110 (the highly-concentrated n-type SiC layer 136) and the ohmic electrode layer 144. Further, the favorable ohmic junction can be formed between the SiC substrate 110 (the highly-concentrated n type SiC layer 136) and the ohmic electrode layer 144 without performing high temperature annealing step and hence, there is no possibility that the problems which the conventional method for manufacturing a silicon carbide semiconductor device has arise.

Embodiment 2

FIG. 4A to FIG. 6D are views for explaining a method for manufacturing a silicon carbide semiconductor device according to an embodiment 2. FIG. 4A to FIG. 4D, FIG. 5A to FIG. 5E and FIG. 6A to FIG. 6D are views showing respective steps. In the embodiment 2, the present invention is explained by taking a case where a pn diode is manufactured as a silicon carbide semiconductor device as an example.

The method for manufacturing a silicon carbide semiconductor device according to the embodiment 2 includes: "SiC substrate preparing step"; "guard ring layer and p$^+$ type SiC region forming step"; "protective insulation film forming step"; "nitride film and thermal oxide film removing step"; "highly-concentrated nitrogen introducing step (first step)"; "highly-concentrated n-type SiC layer forming step (second step)", "opening forming step"; "anode electrode layer forming step"; and "ohmic electrode layer forming step (third step)". Hereinafter, the method for manufacturing a silicon carbide semiconductor device according to the embodiment 2 is explained in accordance with these steps.

1. SiC Substrate Preparing Step

Figure 4A:
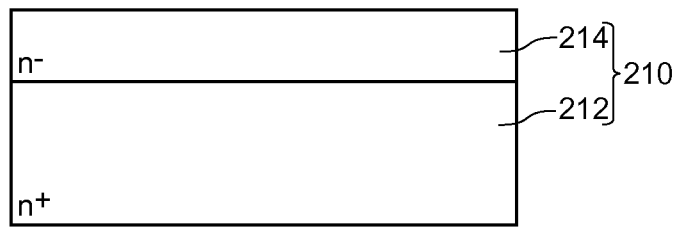
FIG. 4A to FIG. 4D are views for explaining a method for manufacturing a silicon carbide semiconductor device according to an embodiment 2.

Firstly, an SiC substrate 210 having the structure where an n$^+$ type SiC layer 212 and an n$^-$ type SiC layer 214 which is epitaxially grown on the n$^+$ type SiC layer 212 are laminated to each other is prepared (see FIG. 4A). A thickness of the n$^+$ type SiC layer 212 is 400 μm, for example, and the impurity concentration of the n$^+$ type SiC layer 212 is $5 \times 10^{18}$ cm$^{-3}$, for example. A thickness of the n$^-$ type SiC layer 214 is 10 μm, for example, and the impurity concentration of the n$^-$ type SiC layer 214 is $1 \times 10^{16}$ cm$^{-3}$, for example.

2. Guard Ring Layer and p$^+$ Type SiC Region Forming Step

Figure 4B:
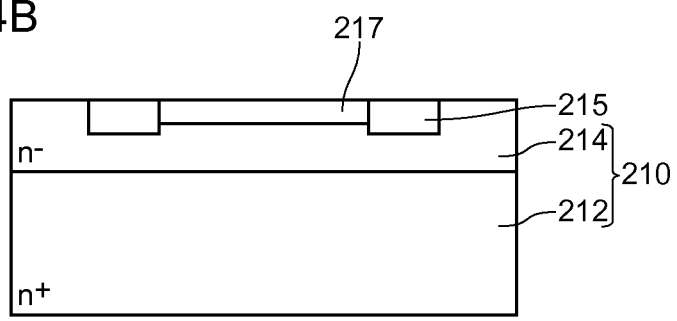
Figure 4C:
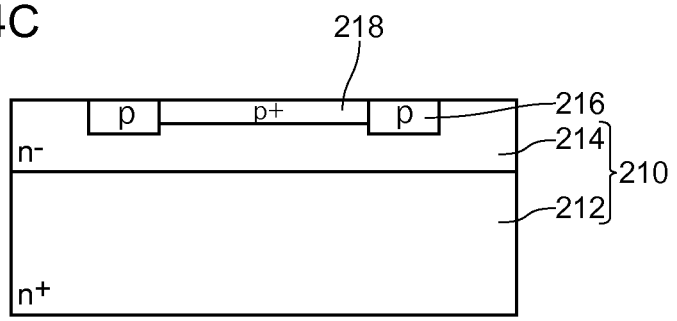
Figure 4D:
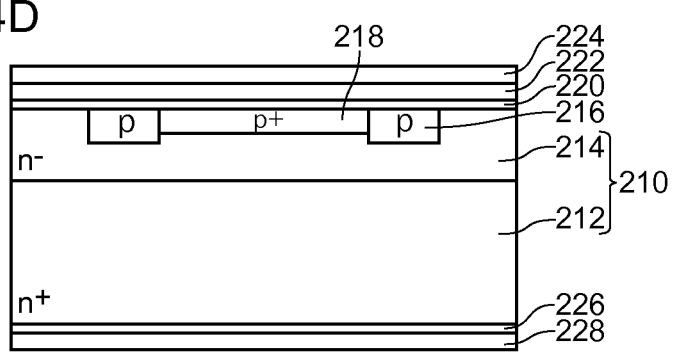

Then, an Al ion introduced region 215 is formed by introducing Al ion into a predetermined region (outer peripheral portion) on a surface of the n$^-$ type SiC layer 214 by an ion implantation method, and an Al ion introduced region 217 is formed by introducing Al ion into a predetermined region (main surface portion) on the surface of the n$^-$ type SiC layer 214 by an ion implantation method (see FIG. 4B). The energy of the ion implantation at the time of forming the Al ion introduced region 215 is 30 to 400 keV, for example, and the energy of the ion implantation at the time of forming the Al ion introduced region 217 is 30 to 200 keV, for example. A depth of the Al ion introduced region 215 is 0.5 μm, for example, and impurity concentration in the Al ion introduced region 215 is 2 to $5 \times 10^{17}$ cm$^{-3}$, for example. A depth of the Al ion introduced region 217 is 0.2 μm, for example, and impurity concentration in the Al ion introduced region 217 is 0.5 to $5 \times 10^{19}$ cm$^{-3}$, for example. Then, annealing treatment (activated annealing treatment) of Al ion is performed at a temperature of 1500° C. or above thus forming a p-type guard ring region 216 and a p⁺ type SiC region 218 (see FIG. 4C).

3. Protective Insulation Film Forming Step

Then, a thermal oxide film 220 is formed on the other surface (n⁻ type SiC layer 214) of the SiC substrate 210 by a thermal oxidation method using wet oxygen (Wet O$_2$), and a thermal oxide film 226 is formed on one surface of the SiC substrate 210 (n⁺ type SiC layer 212). When the other surface side of the SiC substrate 210 is a (0001) Si plane, a film thickness of the thermal oxide film 220 is 0.06 μm, for example. When one surface side of the SiC substrate 210 is a (000-1) C plane, a film thickness of the thermal oxide film 226 is 0.6 μm, for example. Then, an NSG film 222 is formed on the thermal oxide film 220 by a TEOS or CVD method, for example. A film thickness of the NSG film 222 is 1 μm, for example. Then, a Si$_3$N$_4$ film (nitride film) 224 is formed on the NSG film 222 by a reduced pressure CVD method. Here, a Si$_3$N$_4$ film (nitride film) 228 is formed also on the thermal oxide film 226 formed on a back surface of the SiC substrate 210. Film thicknesses of both nitride films 224, 228 are 0.1 μm, for example. Accordingly, a protective insulation film which is constituted of the thermal oxide film 220, the NSG film 222 and the nitride film 224 is formed on the other surface of the n⁻ type SiC substrate 210 (the surface of the n⁻ type SiC layer 214), and a protective insulation film which is constituted of the thermal oxide film 226 and the nitride film 228 is formed on one surface of the SiC substrate 210 (the surface of the n⁺ type SiC layer 212) (see FIG. 4D).

4. Nitride Film and Thermal Oxide Film Removing Step

Then, out of the nitride films 224, 228, the nitride film 228 formed on one surface side of the SiC substrate 210 (n⁺ type SiC layer 212 side) is removed by capacitive coupling type dry etching. At the same time, out of the thermal oxide films 220, 226, the thermal oxide film 226 formed on one surface side of the SiC substrate 210 (the n⁺ type SiC layer 212) is removed by a buffered hydrofluoric acid (see FIG. 5A).

5. Highly-Concentrated Nitrogen Introducing Step (First Step of Method of the Present Invention)

Figure 5A:
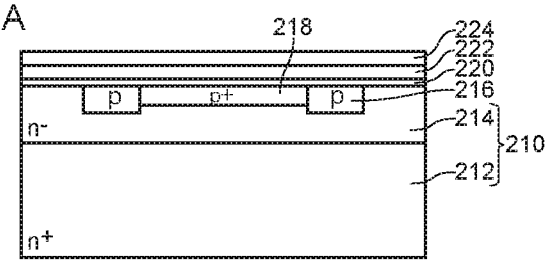
FIG. 5A to FIG. 5E are views for explaining the method for manufacturing a silicon carbide semiconductor device according to the embodiment 2.
Figure 5B:
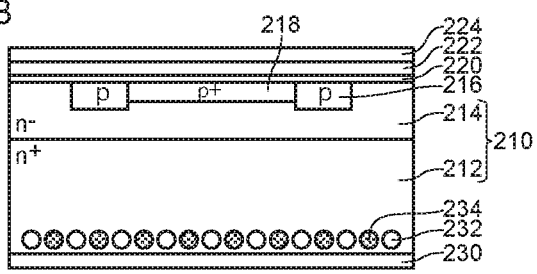

Then, a thermal oxide film 230 is formed by thermally oxidizing one surface of the SiC substrate 210 (a surface of the n⁺ type SiC layer 212) at a temperature of 1150° C. or above in a gas atmosphere including molecules (NO, for example) which contain nitrogen and oxygen (see FIG. 5B). Here, highly-concentrated nitrogen is introduced into one surface of the SiC substrate 210 (a surface of the n⁺ type SiC layer 212). The nitrogen introduced into one surface of the SiC substrate 210 (a surface of the n⁺ type SiC layer 212) includes "nitrogen 232 introduced into a lattice of SiC" and nitrogen which constitutes "Si—N bonded bodies and C—N bonded bodies 234".

In the highly-concentrated nitrogen introducing step, the nitride film 224 exists on the other surface of the SiC substrate 210 (a surface of the n⁻ type SiC layer 214). Accordingly, no nitrogen is introduced into the other surface of the SiC substrate 210 (a surface of the n⁻ type SiC layer 214).

In the highly-concentrated nitrogen introducing step, as understood from FIG. 9 described later, highly-concentrated nitrogen is introduced not only into the inside of the thermal oxide film 230 but also into one surface side of the SiC substrate 210 (a surface of n⁺ type SiC layer 212) (to a depth position of 5 to 20 nm from a lower surface of the thermal oxide film 230, for example). Here, the maximum nitrogen concentration in the thermal oxide film 230 becomes $2 \times 10^{20}$ cm$^{-3}$, for example, and nitrogen concentration on a boundary surface between the thermal oxide film 230 and the SiC substrate 210 becomes $8 \times 10^{19}$ cm$^{-3}$, for example.

6. Highly-Concentrated n-Type SiC Layer Forming Step (Second Step of the Method of the Present Invention)

(1) Thermal Oxide Film Removing Step

Figure 5C:
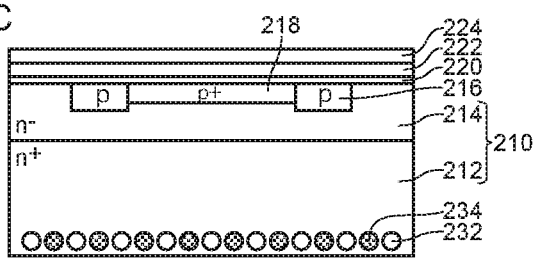

Then, the thermal oxide film 230 is removed from one surface of the SiC substrate 210 (the surface of the n⁺ type SiC layer 212) by wet etching using a buffered hydrofluoric acid (see FIG. 5C).

(2) Radical Exposure Step

Figure 5D:
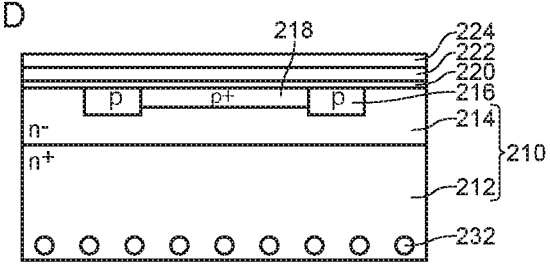
Figure 5E:
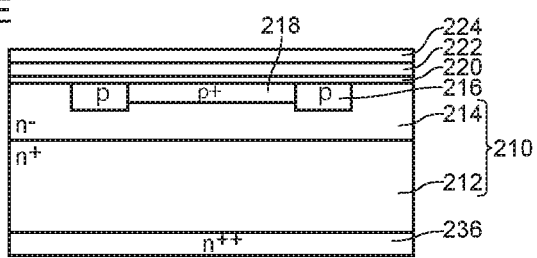

Then, one surface of the SiC substrate 210 (a surface of the n⁺ type SiC layer 212) is exposed to radicals so that Si—N bonded bodies and C—N bonded bodies which are formed on one surface of the SiC substrate 210 (a surface of the n⁺ type SiC layer 212) in the course of introducing highly-concentrated nitrogen into one surface of the SiC substrate 210 (a surface of the n⁺ type SiC layer 212) are removed while leaving nitrogen introduced into a lattice of SiC out of nitrogen introduced into one surface of the SiC substrate 210 (a surface of the n⁺ type SiC layer 212) thus forming a highly-concentrated n type SiC layer (n⁺⁺ type SiC layer) 236 on one surface of the SiC substrate 210 (a surface of the n⁺ type SiC layer 212) (see FIG. 5D). In this radical exposure step, radicals are supplied to one surface of the SiC substrate 210 (a surface of the n⁺ type SiC layer 212) by a remote plasma method. As a radical supply source, CF$_4$, C$_2$F$_6$, SiF$_4$, F$_2$ and/or O$_2$ are used, for example.

7. Opening Forming Step

Figure 6A:
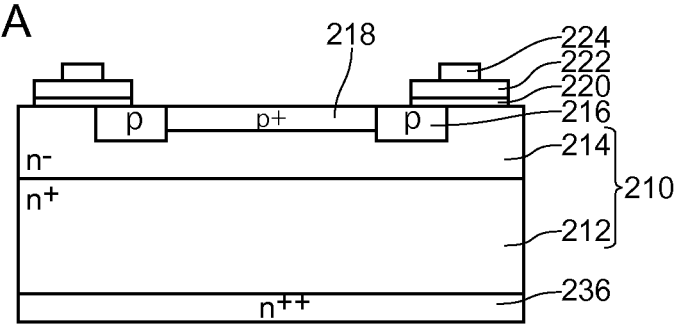
FIG. 6A to FIG. 6D are views for explaining the method for manufacturing a silicon carbide semiconductor device according to the embodiment 2.
Figure 6B:
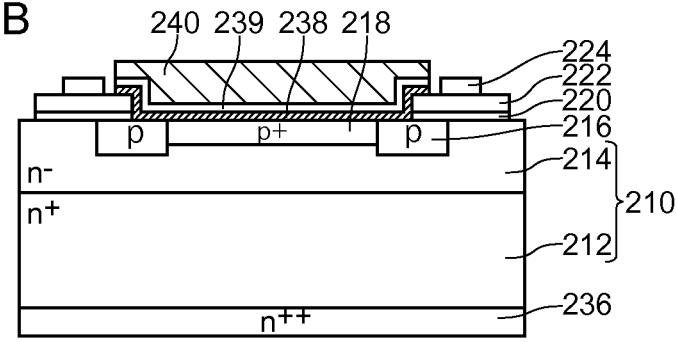
Figure 6C:
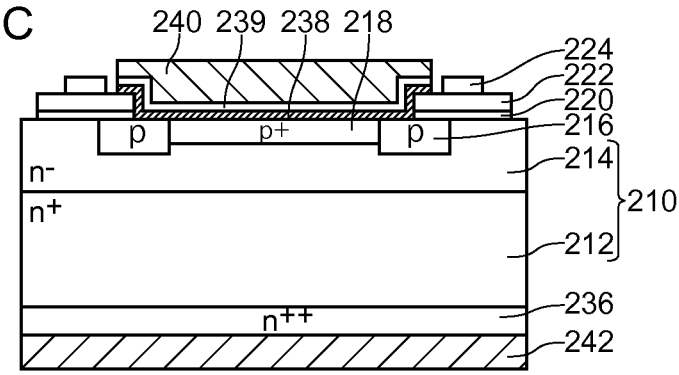
Figure 6D:
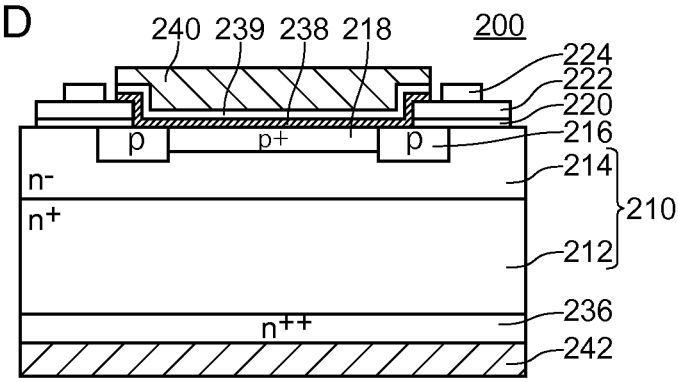

Then, openings having predetermined shapes are formed in the nitride film 224, the NSG film 222 and the thermal oxide film 220 respectively by capacitive-coupling-type dry etching and wet etching using a buffered hydrofluoric acid, for example (see FIG. 6A).

8. Anode Electrode Layer Forming Step

Then, an ohmic electrode layer 238 is formed in the above-mentioned openings on the other surface of the SiC substrate 210 (a surface of the n⁻ type SiC layer 214). The ohmic electrode layer is formed by annealing the SiC substrate 210 at a temperature of 950° C. or above after laminating a Ti layer (0.1 μm)/Al layer (0.1 μm) on the other surface of the SiC substrate 210, for example. Then, an electrode layer 239 formed of a Ti layer having a thickness of 0.1 μm, for example, is formed on the ohmic electrode layer 238. The electrode layer 239 is formed for ensuring a contact between the ohmic electrode layer 238 and a wire connection metal layer 240. Then, the wire connection metal layer 240 made of Al, for example, is formed on the electrode layer 239. A thickness of the wire connection metal layer 240 is 3 μm, for example. Accordingly, an anode electrode layer constituted of the ohmic electrode layer 238, the electrode layer 239 and the wire connection metal layer 240 is formed on the other surface of the SiC substrate 210 (a surface of the n⁻ type SiC layer 214) (see FIG. 6B).

9. Ohmic Electrode Layer Forming Step (1) Ohmic Electrode Layer Film Forming Step Then, an ohmic electrode layer 242 formed of a laminated film consisting of a Ti layer (0.1 μm), an Ni layer (0.5 μm) and an Ag layer (0.1 μm), for example, is formed on one surface of the SiC substrate 210 (surface of highly-concentrated n-type SiC layer 236). Here, the highly-concentrated n type SiC layer (n⁺⁺ type SiC layer) 236 is formed on one surface of the SiC substrate 210 and hence, a favorable ohmic junction can be formed between the SiC substrate 210 and the ohmic electrode layer 242. The ohmic electrode layer 242 constitutes a cathode electrode layer of a pn diode (see FIG. 6C).

(2) Low-Temperature Annealing Step

Then, the ohmic electrode layer 242 is annealed by low-temperature annealing at a temperature which falls within a range of 400° C. to 550° C. (for example, 450° C.) thus forming a more favorable ohmic junction between the SiC substrate 210 (highly-concentrated n-type SiC layer 236) and the ohmic electrode layer 242 (see FIG. 6D).

By carrying out the above-mentioned steps, the silicon carbide semiconductor device 200 (pn diode) can be manufactured.

According to the method for manufacturing a silicon carbide semiconductor device of the embodiment 2, highly-concentrated nitrogen is introduced into one surface of the SiC substrate 210 in the first step. In the second step, by exposing one surface of the SiC substrate 210 to radicals, the Si—N bonded bodies and the C—N bonded bodies (bonded bodies which increase electric resistance) which are formed on one surface of the SiC substrate 210 in the course of introducing highly-concentrated nitrogen into one surface of the SiC substrate 210 are removed while leaving nitrogen (nitrogen working as a donor and decreasing electric resistance) introduced into a lattice of SiC out of highly-concentrated nitrogen introduced into one surface of the SiC substrate 210 thus forming the highly-concentrated n-type SiC layer 236 on one surface of the SiC substrate 210 (see FIG. 9 described later, wherein nitrogen having concentration of $8\times10^{19}$ cm$^{-3}$ still remains even after a thermal oxide film having a depth of approximately 30 nm from the surface is removed). Accordingly, in the succeeding third step, in forming the ohmic electrode layer 242 on one surface of the SiC substrate 210, by merely performing an annealing step at a relatively low temperature or even when an annealing step per se is omitted, it is possible to form a favorable ohmic junction between the SiC substrate and the ohmic electrode layer.

As a result, according to the method for manufacturing a silicon carbide semiconductor device of the embodiment 2, it is unnecessary to perform a high-temperature annealing step as described above and hence, the ohmic electrode layer can be formed on the surface of the SiC layer without performing the high-temperature annealing step.

Further, according to the method for manufacturing a silicon carbide semiconductor device of the embodiment 2, it is unnecessary to perform the high-temperature annealing step as described above and hence, there is no possibility that "carbon which is produced as a byproduct" and "peeled-off electrode material" generated in the high-temperature annealing step become a contamination source in succeeding steps and contaminate a manufacturing line.

Further, according to the method for manufacturing a silicon carbide semiconductor device of the embodiment 2, the first step is performed under the condition where the nitrogen concentration on the boundary surface between the thermal oxide film 230 and the SiC substrate 210 becomes $5\times10^{19}$ cm$^{-3}$ or more and hence, it is possible to introduce nitrogen of sufficiently high concentration into one surface of the SiC substrate 210.

Further, according to the method for manufacturing a silicon carbide semiconductor device of the embodiment 2, the first step is performed under the condition where the maximum nitrogen concentration in the thermal oxide film 230 becomes $1\times10^{20}$ cm$^{-3}$ or more and hence, it is possible to introduce nitrogen of sufficiently high concentration into one surface of the SiC substrate 210.

Further, according to the method for manufacturing a silicon carbide semiconductor device of the embodiment 2, in the first step, nitrogen is introduced into the SiC substrate to a depth position of 5 to 20 nm from a lower surface of the thermal oxide film 230 and hence, the highly-concentrated n-type SiC layer can be formed down to a depth position sufficiently deep from one surface of the SiC substrate.

Further, according to the method for manufacturing a silicon carbide semiconductor device of the embodiment 2, the first step is performed in a state where the other surface of the SiC substrate 210 is covered with the nitride film and hence, nitrogen is not introduced into the other surface of the SiC substrate 210.

Further, according to the method for manufacturing a silicon carbide semiconductor device of the embodiment 2, in the second step, the thermal oxide film 230 is removed from one surface of the SiC substrate 210 by wet etching using a buffered hydrofluoric acid and hence, one surface of the SiC substrate 210 is completely exposed and, thereafter, one surface of the SiC substrate 210 in a completely exposed state can be exposed to the radicals.

Further, according to the method for manufacturing a silicon carbide semiconductor device of the embodiment 2, in the second step, radicals are supplied to one surface of the SiC substrate 210 using a remote plasma method. Accordingly, the highly-concentrated n-type SiC layer can be formed on one surface of the SiC substrate 210 by removing "Si—N bonded bodies and the C—N bonded bodies 234" formed on one surface of the SiC substrate 210 in the course of introducing highly-concentrated nitrogen into one surface of the SiC substrate 210 while leaving nitrogen 232 introduced into a lattice of SiC out of highly-concentrated nitrogen introduced into one surface of the SiC substrate 210.

Further, according to the method for manufacturing a silicon carbide semiconductor device of the embodiment 2, in the second step, $CF_4$, $C_2F_6$, $SiF_4$, $F_2$ and/or $O_2$ are/is used as a radical supply source and hence, only the Si—N bonded bodies and the C—N bonded bodies can be selectively removed by a remote plasma method.

Further, according to the method for manufacturing a silicon carbide semiconductor device of the embodiment 2, in the third step, the ohmic electrode layer is formed on one surface of the SiC substrate and, thereafter, annealing is performed at a temperature which falls within a range of 400° C. to 550° C. and hence, resistance at a junction portion between the SiC substrate 210 (highly-concentrated n-type SiC layer 236) and the ohmic electrode layer 242 can be decreased whereby the favorable ohmic junction can be formed between the SiC substrate 210 (highly-concentrated n-type SiC layer 236) and the ohmic electrode layer 242. Further, the favorable ohmic junction can be formed between the SiC substrate 210 (highly-concentrated n-type SiC layer 236) and the ohmic electrode layer 242 without performing a high-temperature annealing step and hence, drawbacks that the conventional method for manufacturing a silicon carbide semiconductor device has does not arise.

Embodiment 3

Figure 7A:
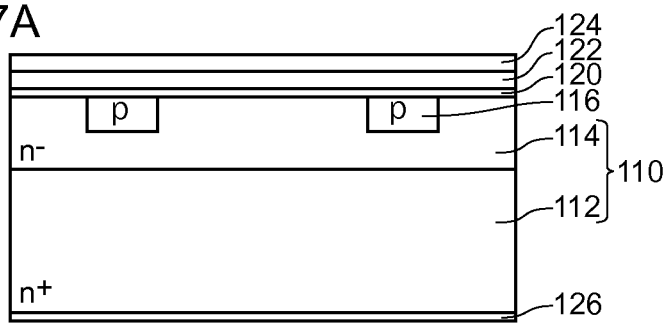
FIG. 7A and FIG. 7B are views for explaining a method for manufacturing a silicon carbide semiconductor device according to an embodiment 3.
Figure 7B:
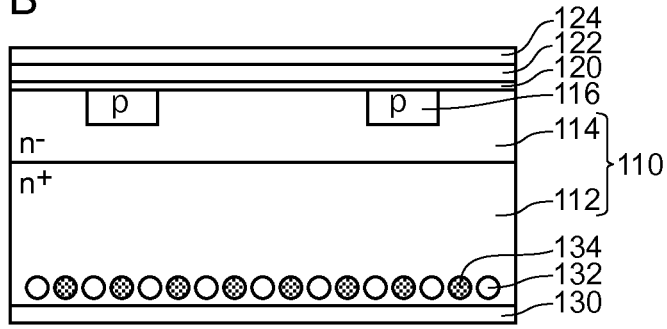

FIG. 7A and FIG. 7B are views for explaining a method for manufacturing a silicon carbide semiconductor device according to an embodiment 3. FIG. 7A and FIG. 7B are views showing some steps. In the embodiment 3, the present invention is explained by taking a case where a Schottky barrier diode is manufactured as a silicon carbide semiconductor device as an example.

The method for manufacturing a silicon carbide semiconductor device of the embodiment 3 basically includes the substantially same steps as the method for manufacturing a silicon carbide semiconductor device according to the embodiment 1. However, the method for manufacturing a silicon carbide semiconductor device according to the embodiment 3 differs from the method for manufacturing a silicon carbide semiconductor device according to the embodiment 1 with respect to a point that a highly-concentrated nitrogen introducing step is performed in a state where a thermal oxide film 126 remains on one surface side of an SiC layer 110. That is, in the method for manufacturing a silicon carbide semiconductor device according to the embodiment 3, the highly-concentrated nitrogen introducing step is performed in a state where the thermal oxide film 126 remains on one surface side of the SiC layer 110 (see FIG. 7B) by removing only the nitride film 128 from one surface side of the SiC layer 110 (see FIG. 7A).

In this manner, the method for manufacturing a silicon carbide semiconductor device of the embodiment 3 differs from the method for manufacturing a silicon carbide semiconductor device of the embodiment 1 with respect to the point that the highly-concentrated nitrogen introducing step is performed in a state where the thermal oxide film 126 remains on one surface side of the SiC layer 110. However, in the same manner as the method for manufacturing a silicon carbide semiconductor device of the embodiment 1, highly-concentrated nitrogen is introduced into one surface of the SiC substrate 110 in the first step. In the second step, by exposing one surface of the SiC substrate 110 to radicals, the Si—N bonded bodies and the C—N bonded bodies (bonded bodies increasing electric resistance) which are formed on one surface of the SiC substrate 110 in the course of introducing highly-concentrated nitrogen into one surface of the SiC substrate 110 are removed while leaving nitrogen (nitrogen working as a donor and decreasing electric resistance) introduced into a lattice of SiC out of highly-concentrated nitrogen introduced into one surface of the SiC substrate 110 thus forming the highly-concentrated n-type SiC layer 136 on one surface of the SiC substrate 110. Accordingly, in the succeeding third step, in forming the ohmic electrode layer 144 on one surface of the SiC substrate 110, by merely performing an annealing step at a relatively low temperature or even when an annealing step per se is omitted, it is possible to form a favorable ohmic junction between the SiC substrate and the ohmic electrode layer. As a result, according to the method for manufacturing a silicon carbide semiconductor device of the embodiment 3, in the same manner as the method for manufacturing a silicon carbide semiconductor device of the embodiment 1, it is unnecessary to perform a high-temperature annealing step as described above and hence, the ohmic electrode layer can be formed on the surface of the SiC layer without performing the high-temperature annealing step.

As a result of an experiment carried out by the inventors of the present invention, it is confirmed that highly-concentrated nitrogen can be introduced into one surface of the SiC substrate 110 through the thermal oxide film 126 in the highly-concentrated nitrogen introducing step even when the highly-concentrated nitrogen introducing step is performed in a state where the thermal oxide film 126 remains on one surface side of the SiC layer 110. Further, in the method for manufacturing a silicon carbide semiconductor device of the embodiment 3, in the "thermal oxide film removing step" of the "highly-concentrated n-type SiC layer forming step (second step)", the thermal oxide film 130 and the thermal oxide film 126 are removed from one surface of the SiC substrate 110 by wet etching using a buffered hydrofluoric acid.

Embodiment 4

Figure 8A:
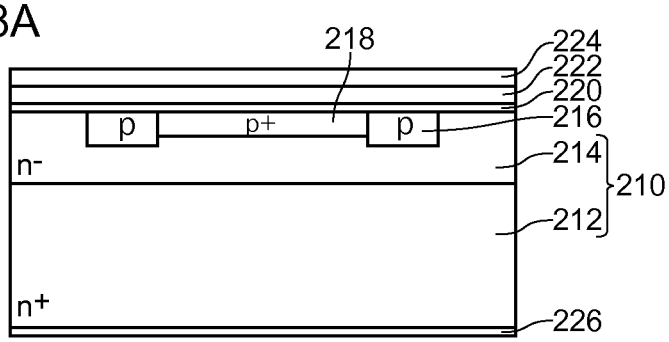
FIG. 8A and FIG. 8B are views for explaining a method for manufacturing a silicon carbide semiconductor device according to an embodiment 4.
Figure 8B:
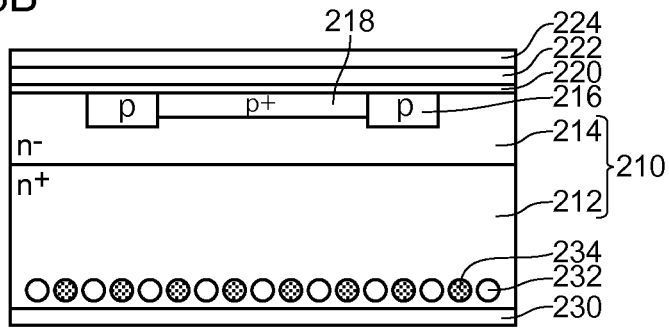

FIG. 8A and FIG. 8B are views for explaining a method for manufacturing a silicon carbide semiconductor device according to an embodiment 4. FIG. 8A and FIG. 8B are views showing some steps. In the embodiment 4, the present invention is explained by taking a case where a pn diode is manufactured as a silicon carbide semiconductor device as an example.

The method for manufacturing a silicon carbide semiconductor device of the embodiment 4 basically includes the substantially same steps as the method for manufacturing a silicon carbide semiconductor device according to the embodiment 2. However, the method for manufacturing a silicon carbide semiconductor device according to the embodiment 4 differs from the method for manufacturing a silicon carbide semiconductor device according to the embodiment 2 with respect to a point that a highly-concentrated nitrogen introducing step is performed in a state where a thermal oxide film 226 remains on one surface side of an SiC layer 210. That is, in the method for manufacturing a silicon carbide semiconductor device according to the embodiment 4, the highly-concentrated nitrogen introducing step is performed in a state where the thermal oxide film 226 remains on one surface side of the SiC layer 210 (see FIG. 8B) by removing only the nitride film 228 from one surface side of the SiC layer 210 (see FIG. 8A).

In this manner, the method for manufacturing a silicon carbide semiconductor device of the embodiment 4 differs from the method for manufacturing a silicon carbide semiconductor device of the embodiment 2 with respect to the point that the highly-concentrated nitrogen introducing step is performed in a state where the thermal oxide film 226 remains on one surface side of the SiC layer 210. However, in the same manner as the method for manufacturing a silicon carbide semiconductor device of the embodiment 2, highly-concentrated nitrogen is introduced into one surface of the SiC substrate 210 in the first step. In the second step, by exposing one surface of the SiC substrate 210 to radicals, the Si—N bonded bodies and the C—N bonded bodies (bonded bodies increasing electric resistance) which are formed on one surface of the SiC substrate 210 in the course of introducing highly-concentrated nitrogen into one surface of the SiC substrate 210 are removed while leaving nitrogen (nitrogen working as a donor and decreasing electric resistance) introduced into a lattice of SiC out of highly-concentrated nitrogen introduced into one surface of the SiC substrate 210 thus forming the highly-concentrated n-type SiC layer 236 on one surface of the SiC substrate 210. Accordingly, in the succeeding third step, in forming the ohmic electrode layer 242 on one surface of the SiC substrate 210, by merely performing an annealing step at a relatively low temperature or even when an annealing step per se is omitted, it is possible to form a favorable ohmic junction between the SiC substrate and the ohmic electrode layer. As a result, according to the method for manufacturing a silicon carbide semiconductor device of the embodiment 4, in the same manner as the method for manufacturing a silicon carbide semiconductor device of the embodiment 2, it is unnecessary to perform a high-temperature annealing step as described above and hence, the ohmic electrode layer can be formed on the surface of the SiC layer without performing the high-temperature annealing step.

As a result of an experiment carried out by the inventors of the present invention, it is confirmed that highly-concentrated nitrogen can be introduced into one surface of the SiC substrate 210 through the thermal oxide film 226 in the highly-concentrated nitrogen introducing step even when the highly-concentrated nitrogen introducing step is performed in a state where the thermal oxide film 226 remains on one surface side of the SiC layer 210. Further, in the method for manufacturing a silicon carbide semiconductor device of the embodiment 4, in the "thermal oxide film removing step" of the "highly-concentrated n-type SiC layer forming step (second step)", the thermal oxide film 230 and the thermal oxide film 226 are removed from one surface of the SiC substrate 210 by wet etching using a buffered hydrofluoric acid.

EXAMPLE 1

The example 1 is an example for showing a fact that highly-concentrated nitrogen can be introduced into one surface of the SiC substrate by performing the first step of the present invention.

1. Preparation of Specimen

In the steps of performing the method for manufacturing a silicon carbide semiconductor device according to the embodiment 3, at a point of time that the first step is finished (see FIG. 7B), the SiC substrate 110 is taken out, and is cut on a plane which includes an axis along the depth direction of the SiC substrate 110 thus preparing a specimen 1 (example).

2. Evaluation Method

The concentration distributions of Si, C and N in the specimen 1 along the depth direction from one surface side of the SiC substrate 110 are measured by a secondary ion mass spectrometry (SIMS).

3. Result of Evaluation

Figure 9:
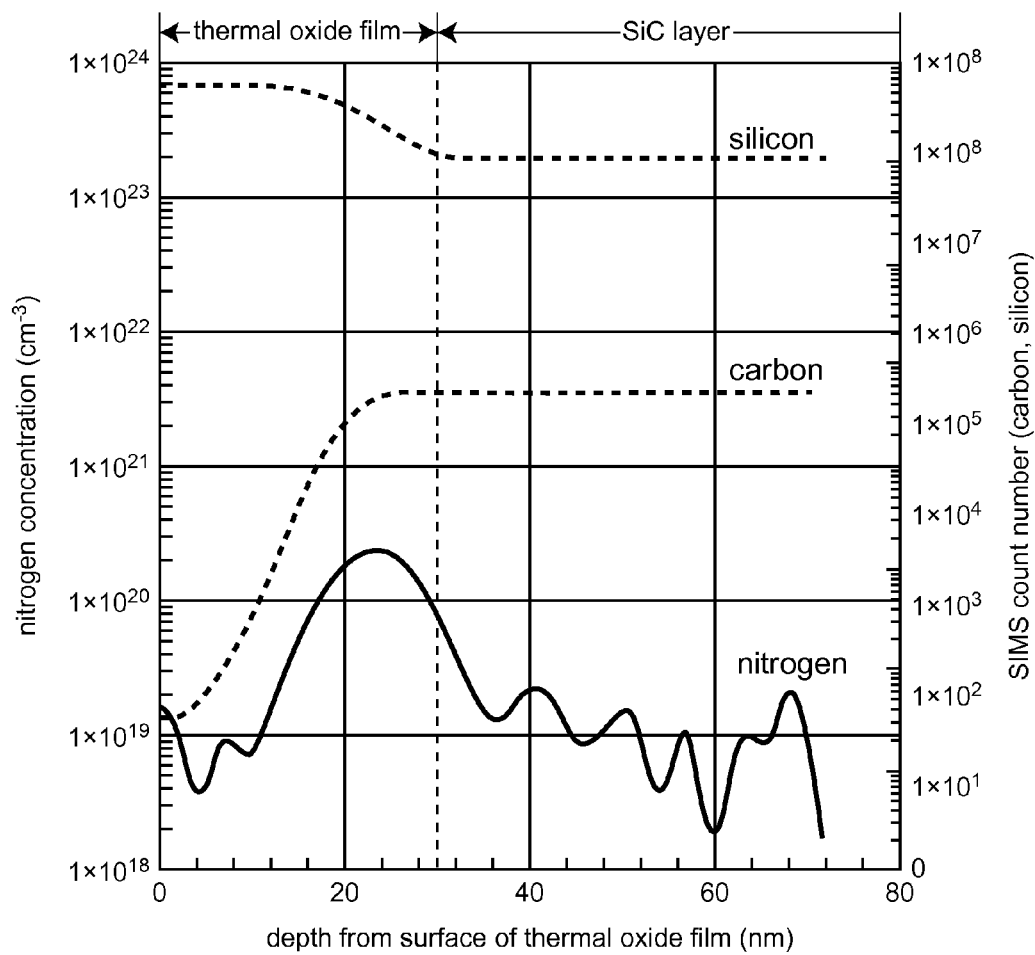
FIG. 9 is a view showing the concentration distributions of Si, C and N along the depth direction in a specimen 1.

FIG. 9 is a view showing the concentration distributions of Si, C and N in the specimen 1 along the depth direction. The concentration distributions of Si and C indicate relative intensities (count numbers), and the concentration distribution of N indicates the nitrogen concentration.

As a result, as shown in FIG. 9, it is found that nitrogen passes through the thermal oxide film and is introduced into the SiC substrate after the first step is finished. The maximum nitrogen concentration in the thermal oxide film is $2.4 \times 10^{20}$ cm$^{-3}$. Nitrogen concentration on a boundary surface between the thermal oxide film and the SiC substrate is $8 \times 10^{19}$ cm$^{-3}$. To take into account that a detection limit of nitrogen concentration is approximately $1 \times 10^{19}$ cm$^{-3}$, it is estimated that nitrogen is introduced into a depth position of approximately 15 nm from the boundary surface between the thermal oxide film and the SiC substrate.

EXAMPLE 2

Example 2 is an example showing a fact that an ohmic junction of low resistance can be formed by carrying out the present invention.

1. Preparation and Evaluation of Specimens

FIG. 10A to FIG. 10C are views for explaining respective specimens (specimens 2 to 4) used in the example 2. FIG. 10A is a cross-sectional view of the specimen 2, FIG. 10B is a cross-sectional view of the specimen 3, and FIG. 10C is a cross-sectional view of the specimen 4.

1-1. Specimen 2

An SiC substrate (n$^+$ type SiC substrate) is prepared, a plurality of rectangular Ti electrodes (film thickness: 0.5 µm) which differ in spaced-apart distance are formed on one surface (a surface on a (000-1) C plane side) of the SiC substrate thus forming the specimen 2 (comparison example) (see FIG. 10A). Then, an I-V characteristic of the specimen 2 is measured.

1-2. Specimen 3

A thermal oxide film is formed by thermally oxidizing one surface (a surface on a (000-1) C plane side) of an SiC substrate (n$^+$ type SiC substrate) at a temperature of 1300° C. for 20 minutes under a mixed gas atmosphere of N$_2$O and N$_2$, and highly-concentrated nitrogen is introduced into one surface of the SiC substrate during the process (first step).

Then, the thermal oxide film formed on one surface of the SiC substrate is removed by wet etching using a buffered hydrofluoric acid and, thereafter, one surface of the SiC substrate is exposed to CF$_4$ and O$_2$ radicals generated by a remote plasma method. Accordingly, a highly-concentrated n-type SiC layer (n$^{++}$-type SiC layer) is formed on one surface of the SiC substrate by removing an Si—N bonded bodies and a C—N bonded bodies formed on one surface of the SiC substrate in the course of introducing highly-concentrated nitrogen into one surface of the SiC substrate while leaving nitrogen introduced into a lattice of SiC out of highly-concentrated nitrogen introduced into one surface of the SiC substrate (second step).

Then, a plurality of rectangular Ti electrodes (film thickness: 0.5 µm) which differ in a spaced-apart distance are formed on one surface of the SiC substrate (a surface of the n$^{++}$-type SiC layer) thus preparing a specimen 3 (example) (see FIG. 10B). Then, an I-V characteristic of the specimen 3 is measured. The measurement of the I-V characteristic is performed by bringing terminals into contact with two arbitrary Ti electrodes.

1-3. Specimen 4

Then, the specimen 3 is annealed at a temperature of 450° C. for 30 minutes in a vacuum atmosphere of a pressure of $1 \times 10^{-6}$ Torr or below thus preparing the specimen 4 (example). Then, an I-V characteristic of the specimen 4 is measured.

3. Result of Evaluation

Figure 12:
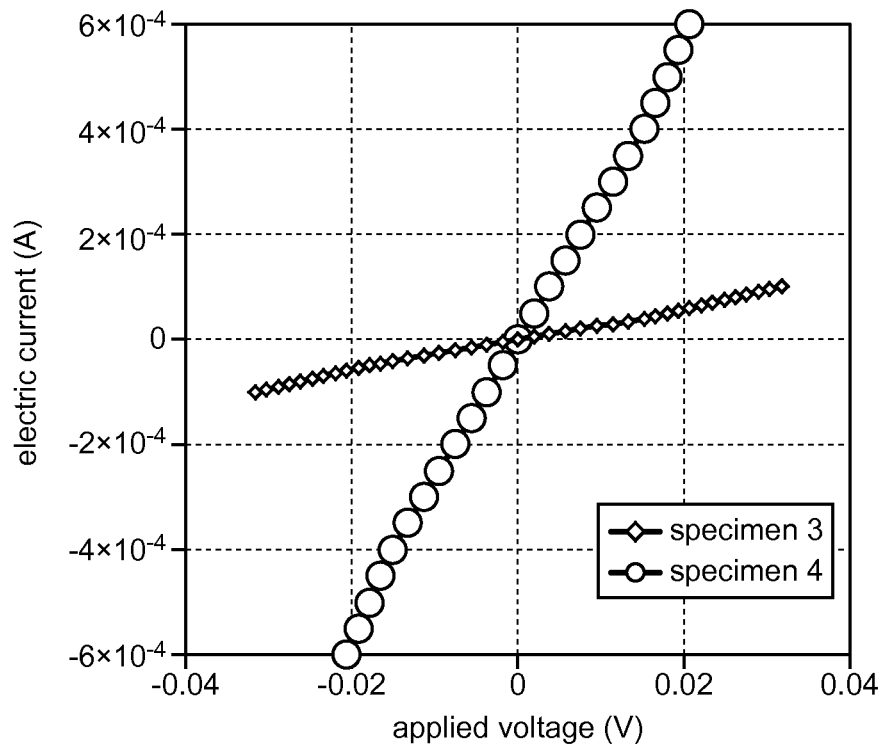
FIG. 12 is a view showing I-V characteristics of the specimen 3 and a specimen 4 in an overlapping manner.

FIG. 11 is a view showing I-V characteristics of the specimen 2 and the specimen 3 in an overlapping manner. FIG. 12 is a view showing the I-V characteristics of the specimen 3 and the specimen 4 in an overlapping manner.

As can be also understood from FIG. 11, it is found that the specimen 3 where the highly-concentrated n-type SiC layer is formed by performing the highly-concentrated nitrogen introducing step and the remote plasma step exhibits a drastically improved ohmic characteristic compared to the specimen 2 where the highly-concentrated n-type SiC layer is not formed. Further, as can be also understood from FIG. 12, it is found that the specimen 4 which is formed by performing annealing at a temperature of 450° C. after forming an electrode on the highly-concentrated n-type SiC layer exhibits a further improved ohmic characteristic compared to the specimen 3 to which annealing at a temperature of 450° C. is not applied after forming an electrode on the highly-concentrated n-type SiC layer.

When contact resistance between the highly-concentrated n-type SiC layer and the Ti electrode is obtained with respect to the specimen 4 by a transfer length method, a low value of "$3.8 \times 10^{-3}$ Ωcm$^2$" is obtained.

EXAMPLE 3

The example 3 is an example for showing a fact that a Schottky junction can be normally maintained even by performing annealing after an ohmic electrode layer is formed.

1. Preparation of Specimens

Schottky barrier diodes obtained by performing the method for manufacturing a silicon carbide semiconductor device of the embodiment 3 are directly used as specimens. However, the specimen obtained by performing an annealing step at a temperature of 350° C. (low temperature annealing step) is used as the specimen 5 (example), the specimen obtained by performing an annealing step at a temperature of 450° C. (low temperature annealing step) is used as the specimen 6 (example), the specimen which is obtained by performing a low temperature annealing step at a temperature of 550° C. (low temperature annealing step) is used as the specimen 7 (example), and the specimen obtained by performing an annealing step at a temperature of 650° C. is used as the specimen 8 (comparison example).

2. Evaluation Method

Figure 13:
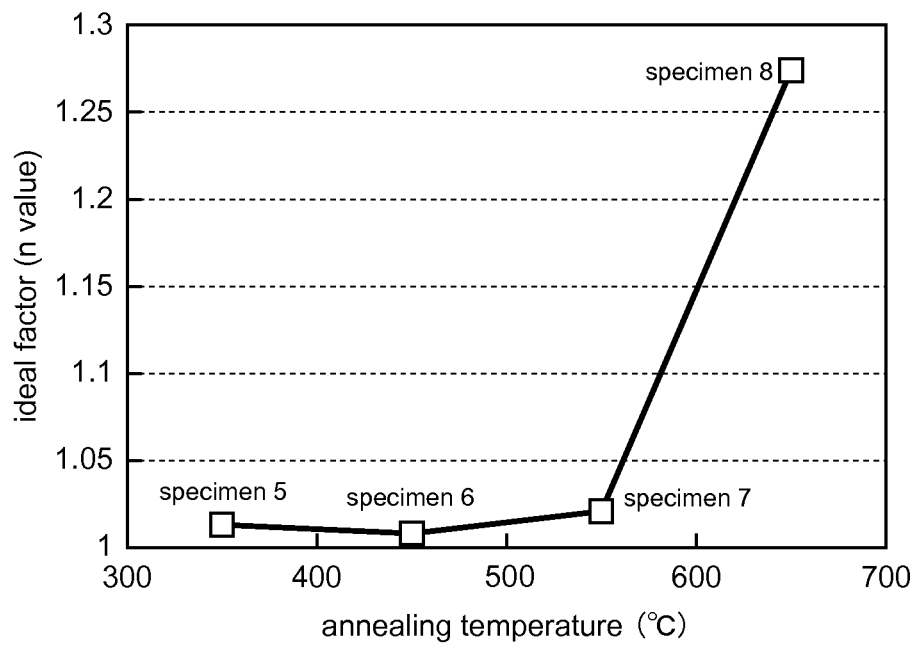
FIG. 13 is a view showing ideal factors (n values) of Schottky barrier diodes with respect to specimens 5 to 8.
Figure 14A:
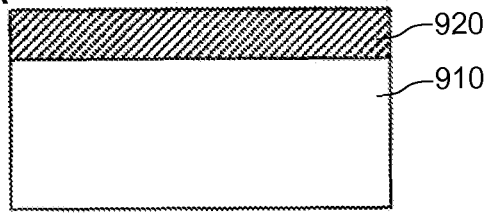
FIG. 14A to FIG. 14E are views for explaining a conventional method for manufacturing a silicon carbide semiconductor device.
Figure 14B:
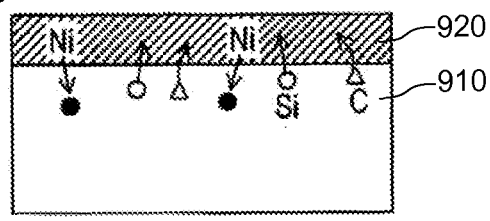
Figure 14C:
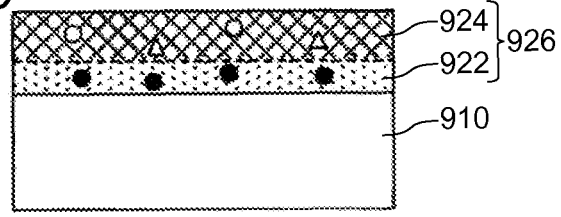
Figure 14D:
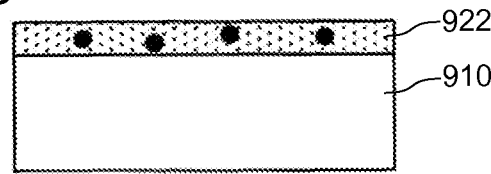
Figure 14E:
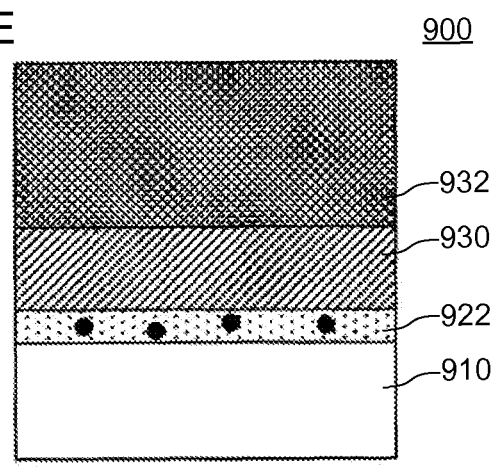

Ideal factors (n values) of Schottky barrier diodes constituting the specimens 5 to 8 are calculated based on forward rising waveforms of the I-V characteristics. FIG. 13 is a view showing ideal factors (n values) of Schottky barrier diodes constituting the specimens 5 to 8.

3. Result of Evaluation

As can be also understood from FIG. 13, it is found that the specimen to which the annealing step is applied at a temperature of 650° C. (specimen 8) exhibits the ideal factor (n value) of 1.27 when the annealing step is performed, and this ideal factor (n value) is considerably higher than an ideal value (1). That is, it is found that a Schottky junction is not maintained in a normal state under such a condition. On the other hand, it is also found that the specimens to which the annealing step is applied at a temperature of 350° C. to 550° C. (specimens 5 to 7) exhibits ideal factors (n values) of approximately 1.01 to 1.02 even when the annealing step (low temperature annealing step) is performed so that the ideal factor becomes substantially equal to the ideal value (1). That is, it is found that a Schottky junction is normally maintained under such a condition.

Although the method for manufacturing a silicon carbide semiconductor device of the present invention has been explained in conjunction with the above-mentioned embodiments, the present invention is not limited to these embodiments. For example, the present invention can be carried out without departing from the gist of the present invention, and the following modifications are also conceivable.

(1) In the above-mentioned embodiments 1 to 4, a thermal oxide film is formed by thermally oxidizing one surface of an SiC substrate in a gas atmosphere including NO as molecules which contain nitrogen and oxygen. However, the present invention is not limited to such embodiments. For example, a thermal oxide film may be formed by thermally oxidizing one surface of an SiC substrate in a gas atmosphere including $N_2O$ as molecules which contain nitrogen and oxygen, for example. Further, a thermal oxide film may be formed by thermally oxidizing one surface of an SiC Substrate in a gas atmosphere including NO and $N_2O$ as molecules which contain nitrogen and oxygen. Still further, a thermal oxide film may be formed on one surface of an SiC substrate by thermal oxidation in a gas atmosphere where NO or $N_2O$ is diluted with nitrogen, oxygen or Ar.

(2) In the above-mentioned embodiments 1 to 4, the ohmic electrode layer forming step is performed by performing a low-temperature annealing step after the ohmic film forming step is performed. However, the present invention is not limited to such embodiments 1 to 4. For example, the ohmic electrode layer forming step may be performed without performing low-temperature annealing step after the ohmic electrode film forming step is performed.

(3) In the above-mentioned embodiments 1 to 4, a thermal oxide film is formed by a thermal oxidation method using wet oxygen ($WetO_2$). However, the present invention is not limited to such embodiments 1 to 4. For example, a thermal oxide film may be formed by a thermal oxidation method using wet oxygen and nitrogen ($WetO_2+N_2$), and may be formed by a thermal oxidation method using dry oxygen ($DryO_2$) or may be formed by a thermal oxidation method using dry oxygen and nitrogen (Dry $O_2+N_2$). Further, a silicon oxide film formed by a CVD may be used as a substitute.

(4) In the above-mentioned embodiment 2, the first step is performed at a temperature of 1300° C. However, the present invention is not limited to such a case. For example, the first step may be performed at a temperature below 1300° C. (for example, at a temperature of 1150° C. or above and below 1300° C.). That is, by performing the first step at a temperature of 1150° C. or above, highly-concentrated nitrogen can be introduced into one surface of the SiC substrate in the course of forming a thermal oxide film by thermally oxidizing one surface of the SiC substrate.

(5) In the above-mentioned embodiments 1 to 4, the explanation has been made by taking the case where a silicon carbide semiconductor device is a Shottky barrier diode or a pn diode as an example. However, the present invention is not limited to such a case. For example, the present invention is applicable to semiconductor devices in general where an ohmic electrode layer is formed on one surface of an SiC substrate such as a semiconductor device (for example, a thyristor) other than a Shottky barrier diode or a pn diode.

REFERENCE SIGNS LIST

100, 200, 900: silicon carbide semiconductor device, 110, 210: SiC substrate, 112, 212: $n^+$ type SiC layer, 114, 214: $n^-$ type SiC layer, 115, 215, 217: Al ion low-concentration introduced region, 116, 216: p-type guard ring region, 120, 126, 220, 226: thermal oxide film (thermal oxide film formed using $WetO_2$), 122, 222: NSG film, 124, 128, 224, 228: SiNx film, 130, 230: thermal oxide film (oxide film formed using NO), 132, 232: nitrogen introduced into lattice of SiC, 134, 234: Si—N bonded body and C—N bonded body; 136, 236: highly-concentrated n-type SiC layer, 138: barrier metal layer (Ti layer), 140, 240: wire connection metal layer (Al layer), 144, 242: ohmic electrode layer (Ti/Ni/Ag layer), 218: $p^+$ type SiC layer, 238: ohmic electrode layer, 239: electrode layer, 910: SiC layer, 920: Ni layer, 922: reaction layer, 924: silicide layer, 930: ohmic electrode layer, 932: other electrode layers

The invention claimed is:

1. A method for manufacturing a silicon carbide semiconductor device comprising the steps in the following order:

a first step of forming a thermal oxide film on one surface of an SiC substrate by thermal oxidation at a temperature of 1150° C. or above in a gas atmosphere including molecules which contain nitrogen and oxygen, and introducing nitrogen to said one surface of the SiC substrate in the course of forming the thermal oxide film;

a second step of forming an n++ type SiC layer on said one surface of the SiC substrate such that the thermal oxide film is removed from said one surface of the SiC substrate by etching and, thereafter, said one surface of the SiC substrate is exposed to radicals so that Si—N bonded bodies and C—N bonded bodies which are formed on said one surface of the SiC substrate in the course of introducing nitrogen into said one surface of the SiC substrate are removed while leaving nitrogen introduced into a lattice of SiC out of the nitrogen introduced into said one surface of the SiC substrate; and a third step of forming an ohmic electrode layer on said one surface of the SiC substrate wherein the first step is carried out under a condition where nitrogen concentration on a boundary surface between the thermal oxide film and the SiC substrate is $5 \times 10^{19}$ cm$^{-3}$ or more.

2. The method for manufacturing a silicon carbide semiconductor device according to claim 1, wherein the first step is carried out under a condition where the maximum nitrogen concentration in the thermal oxide film is $1 \cdot 10^{20}$ cm$^{-3}$ or more.

3. The method for manufacturing a silicon carbide semiconductor device according to claim 1, wherein, in the first step, nitrogen is introduced into the SiC substrate to a depth position of 5 to 20 nm from a lower surface of the thermal oxide film.

4. The method for manufacturing a silicon carbide semiconductor device according to claim 1, wherein the first step is carried out in a state where the other surface of the SiC substrate is covered with a silicon nitride film.

5. The method for manufacturing a silicon carbide semiconductor device according to claim 1, wherein, in the second step, the thermal oxide film is removed from one surface of the SiC substrate by wet etching using a buffered hydrofluoric acid.

6. The method for manufacturing a silicon carbide semiconductor device according to claim 1, wherein, in the second step, the Si—N bonded bodies and the C—N bonded bodies are removed by supplying the radicals to one surface of the SiC substrate using a remote plasma method.

7. The method for manufacturing a silicon carbide semiconductor device according to claim 6, wherein, in the second step, $CF_4$, $C_2F_6$, $SiF_4$, $F_2$ and/or $O_2$ are/is used as a radical source.

8. The method for manufacturing a silicon carbide semiconductor device according to claim 1, wherein, in the third step, the ohmic electrode layer is formed on said one surface of the SiC substrate and, thereafter, resistance at a bonded portion between the SiC substrate and the ohmic electrode layer is decreased by performing annealing at a temperature which falls within a range of 400° C. to 550° C.

9. The method for manufacturing a silicon carbide semiconductor device according to claim 1, wherein the silicon carbide semiconductor device is a Schottky barrier diode.

10. The method for manufacturing a silicon carbide semiconductor device according to claim 1, wherein the silicon carbide semiconductor device is a pn diode.

* * * * *